United States Patent [19]

Tsui et al.

[11] Patent Number: 4,977,365
[45] Date of Patent: Dec. 11, 1990

[54] INSTANTANEOUS FREQUENCY MEASUREMENT (IFM) RECEIVER TO MEASURE FREQUENCY AND ANGLE OF ARRIVAL (AOA) OF MULTIPLE SIGNALS

[75] Inventors: James B. Y. Tsui, Centerville; William S. McCormick, Dayton, both of Ohio

[73] Assignee: The United States of America as represented by the Secretary of the Air Force, Washington, D.C.

[21] Appl. No.: 396,396

[22] Filed: Aug. 17, 1989

[51] Int. Cl.$^5$ ............................................. G01R 23/02
[52] U.S. Cl. .................................................. 324/78 R
[58] Field of Search ................ 324/77 R, 78 R, 78 D, 324/79 R, 79 D, 83 R, 77 D, 77 G, 77 H, 77 B; 364/484; 342/13, 20, 352, 357; 375/114, 97; 455/226

[56] References Cited

U.S. PATENT DOCUMENTS

| | | | |
|---|---|---|---|
| 3,939,411 | 2/1976 | James | 324/77 |
| 4,426,648 | 1/1984 | Tsui | 324/79 R |
| 4,468,793 | 8/1984 | Johnson | 375/97 |
| 4,485,383 | 11/1984 | Maher | 342/352 |
| 4,532,515 | 7/1985 | Cantrell et al. | 343/16 |
| 4,633,516 | 12/1986 | Tsui | 455/226 |
| 4,638,319 | 1/1987 | Chua | 342/417 |

OTHER PUBLICATIONS

Fast Measurement of Signal Parameters in the Presence of Signal-Like Interference-Simultaneous Signal Processing, S. M. Risteen, 10 Mar. 1987.

Primary Examiner—Michael J. Tokar
Attorney, Agent, or Firm—Bernard E. Franz; Donald J. Singer

[57] ABSTRACT

The receiver through an improved Prony method provides a measure of the frequencies, the angle of arrival (AOA) and the phase of signals at the receiver. The device comprises two antennas spaced a known distance apart. These antennas receive signals at different angles. Signals from the antennas are sent to delay lines. Each delay line experiences a different delay period. Signals are then sent to four correlator circuits whose outputs are analog signals which contain all the information required to solve for the frequencies and the angles of arrival of signals at the receiver. The signals are supplied to a digital processor where a mathematical method is used to solve for the frequencies, the phases and the angles of arrival of signals at the receiver.

2 Claims, 3 Drawing Sheets

INSTANTANEOUS FREQUENCY MEASUREMENT (IFM) RECEIVER TO MEASURE FREQUENCY AND ANGLE OF ARRIVAL (AOA) OF MULTIPLE SIGNALS

RIGHTS OF THE GOVERNMENT

The invention described herein may be manufactured and used by or for the Government of the United States for all governmental purposes without the payment of any royalty.

BACKGROUND OF THE INVENTION

The present invention relates generally to an instantaneous frequency measurement (IFM) receiver to measure frequency and angle of arrival (AOA) of multiple signals.

An IFM receiver can have very wide bandwidth, and generate fine frequency information on short pulsed signals. It also has small size and light weight. Although it has all the desired properties required for EW (Electronic Warfare) applications, it has one major deficiency; that is, the IFM receiver can not process simultaneous signals. Worse yet, under a simultaneous signals condition, the receiver may report erroneous frequency data which will confuse the processor following the receiver. Dr. Donald Tufts invented an approach using an IFM receiver to measure the frequencies of simultaneous signals through Prony's method, which is a mathematical method to solve certain equations. This approach is studied through an Air Force contract F33615-85-C-1720. (See the final technical report AFWAL-TR-86-1131, "Fast Measurement of Signal Parameters in the Presence of Signal-Like Interference, Simultaneous Signal Processing", by S. M. Risteen, submitted, Mar. 10, 1987 (Dr. Tufts was a consultant not named in the report)). However, the AOA problem was not properly solved during the contracting period. A closed form solution is needed (reference section 9.3.3. of the said final report).

United States patents by applicant James B. Y. Tsui sole or et al for IFM and other EW receivers include (1) U.S. Pat. No. 4,194,206 issued Mar. 18, 1980 for an Instantaneous Frequency Measurement (IFM) Receiver With Capability to separate CW and Pulsed Signals; (2) U.S. Pat. No. 4,336,541 issued Jun. 22, 1982 for Simultaneous Signal Detector for an Instantaneous Frequency Measurement Receiver; (3) U.S. Pat. No. 4,426,648 issued Jan. 17, 1984 for Simultaneous Signal Detection for an IFM Receivers by Detecting Intermodulation Products; (4) U.S. Pat. No. 4,547,727 issued Oct. 15, 1985 for Simultaneous Signal Detection for IFM Receivers by Transient Detection; (5) U.S. Pat. No. 4,633,516 issued Dec. 30, 1986 for an Instantaneous Frequency Measurement Receiver With Digital Processing; (6) U.S. Pat. No. 4,200,840 issued Apr. 29, 1980 for a Dual Detection Scheme for Compressive Receivers; and (7) U.S. Pat. No. 4,644,267 issued Feb. 17, 1987 for a Signal Analysis Receiver With Acousto-Optic Delay Lines. There is also (8) an application (by Shaw, Tsui & Hedge) Ser. No. 215,662 filed Jul. 6, 1988, for PSK Detection Using an IFM Receiver. These patents and application are hereby incorporated by reference. References (2), (3) and (8) show the circuit of a basic IFM correlator as shown in FIG. 1 herein.

Other United States patents of interest are U.S. Pat. No. 3,939,411 to James, which teaches an IFM system capable of measuring pulse signals of differing frequencies emitted by a single source. U.S. Pat. No. 4,532,515 to Cantrell et al teaches a device for measuring AOA by converting received echoes to complex numbers representing the amplitude and phase. U.S. Pat. No. 4,638,319 to Chua teaches a RF system wherein a phase comparison means provides a signal output and bearing angle.

SUMMARY OF THE INVENTION

An objective of the invention is to extend the capability of an IFM receiver to measure the frequencies and AOAs of simultaneous signals.

The invention extends the approach of the contract referenced in the "Background" above to measure both the frequencies and the AOAs of simultaneous signals. A closed form solution is generated with a proper hardware arrangement.

This invention through an improved Prony method provides a measure of the frequencies, the angle of arrival (AOA) and the phase of signals at the receiver. The device comprises two antennas spaced a known distance apart. These antennas receive signals at different angles. Signals from the antennas are sent to delay lines. Each delay line experiences a different delay period. Signals are then sent to four correlator circuits whose outputs are analog signals which contain all the information required to solve for the frequencies and the angles of arrival of signals at the receiver. The signals are supplied to a digital processor where a mathematical method is used to solve for the frequencies and the angles of arrival of signals at the receiver.

This invention can solve a major deficiency of an IFM receiver. With this modification, it is possible to make the IFM receiver widely applicable for EW applications.

DETAILED DESCRIPTION

Figure 1:
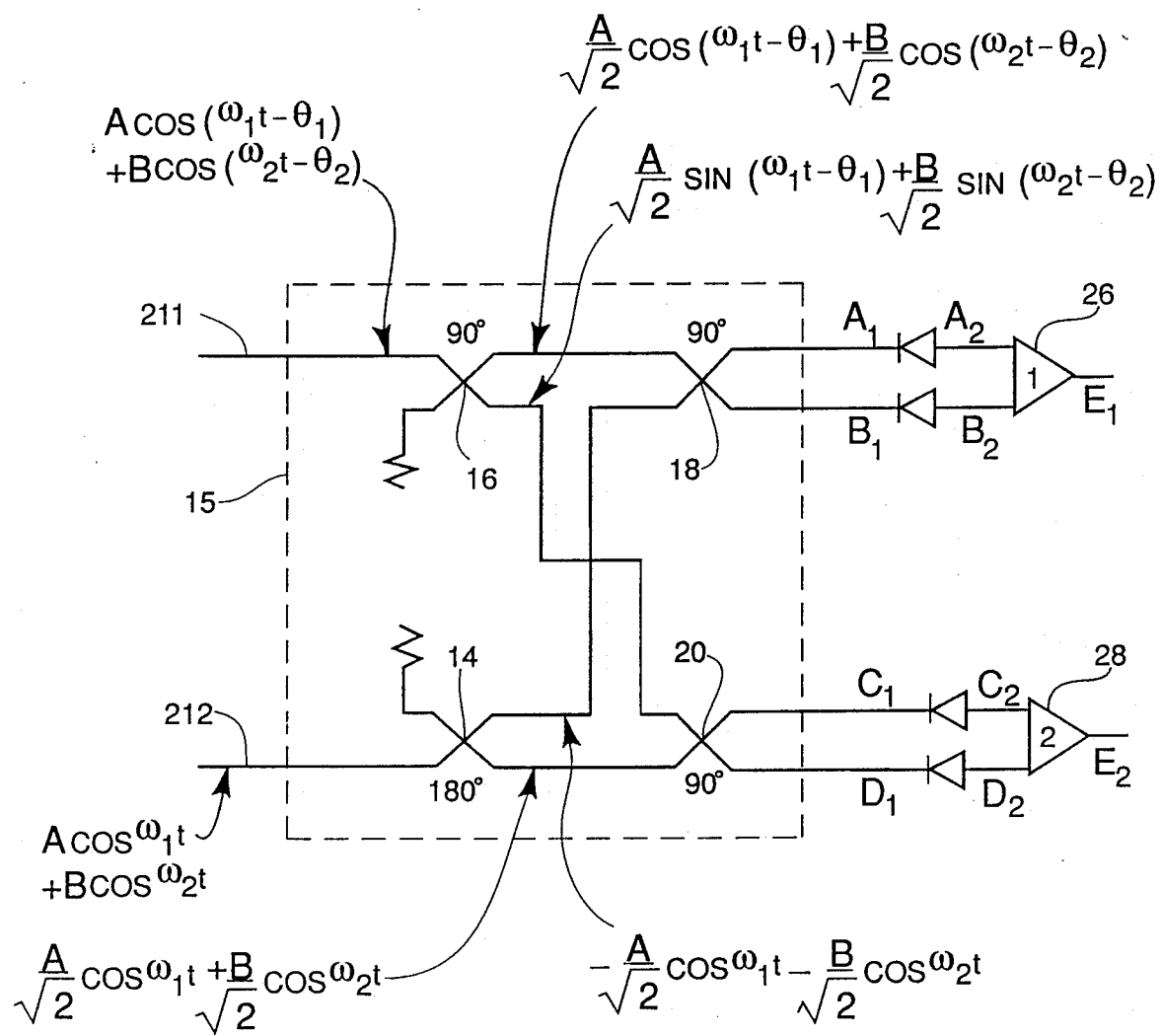
FIG. 1 is a schematic and functional block diagram showing an IFM correlator.

The frequency measurement principle of an IFM receiver is well known. The schematic of an IFM correlator to a basic IFM receiver is shown in FIG. 1. It comprises a phase discriminator 15, four detectors 21-24, and two differential amplifiers 26 and 28 used as comparators. (There is usually a power divider before the phase discriminator 15, and one delay line between the power divider and one of the inputs of the phase discriminator.) The phase discriminator 15 comprises one sum-difference phase shifter (hybrid) 14, and three quadrature phase shifters (hybrids) 16, 18 and 20. After the signal passes through the network, $\sin \omega\tau$ and $\cos \omega\tau$ are presented at the outputs of the differential amplifiers 26 and 28. By comparing $\sin \omega\tau$ and $\cos \omega\tau$, the frequency of the input signal can be determined. The comparison occurs only for a very short time period and only after the frequency measurement circuit reaches a stable state. In most receivers the measurement circuit is stable and sampling occurs 50 to 100 nanoseconds after signal detection. The correlators can also be implemented in a digital form.

1. Introduction

The combined measurement technique on frequencies and AOAs of simultaneous signals including required analog microwave IFM hardware will be discussed in this section. Although the method can be easily extended to multiple signals, in this detailed description, only the two signal case will be treated for reasons of simplicity. The actual hardware realization will contain two antennas and two delay lines. It is assumed that the difference frequency will be filtered out from the receiver output.

2. Performance of a Correlator

In this section, the performance of a correlator under two simultaneous signals will be discussed. The correlator used is shown in FIG. 1. The signals are applied to the two inputs 211 and 212. The only difference between the input signals is that a phase delay is introduced in the signal input of port 1 (line 211). The phase can be caused by either a fixed time delay of a propagation time delay between two antennas. The signals at the inputs to the detectors (label on FIG. 1) are $$A_1 = \frac{A}{2} \cos(\omega_1 t - \theta_1) + \tag{1}$$

$$\frac{B}{2} \cos(\omega_2 t - \theta_2) - \frac{A}{2} \sin \omega_1 t - \frac{B}{2} \sin \omega_1 t$$

$$B_1 = \frac{A}{2} \sin(\omega_1 t - \theta_1) + \tag{2}$$

$$\frac{B}{2} \sin(\omega_2 t - \theta_2) - \frac{A}{2} \cos \omega_1 t - \frac{B}{2} \cos \omega_1 t$$

$$C_1 = \frac{A}{2} \sin(\omega_1 t - \theta_1) + \tag{3}$$

$$\frac{B}{2} \sin(\omega_2 t - \theta_2) - \frac{A}{2} \cos \omega_1 t + \frac{B}{2} \cos \omega_1 t$$

$$D_1 = \frac{-A}{2} \cos(\omega_1 t - \theta_1) + \tag{4}$$

$$\frac{B}{2} \cos(\omega_2 t - \theta_2) - \frac{A}{2} \sin \omega_1 t - \frac{B}{2} \sin \omega_1 t$$

where A, B, $\omega_1$, $\omega_2$, $\theta_1$, $\theta_2$ are the amplitude, frequency, and relative phase of the first and second signals, respectively. Let us assume that the square law characteristic of the diode detectors performs mathematical squaring; therefore, the output from A is $$A_2 = \frac{A^2}{4} \cos^2(\omega_1 t - \theta_1) + \frac{B^2}{4} \cos(\omega_2 t - \theta_2) - \tag{5}$$

$$\frac{A^2}{4} \sin^2 \omega_1 t - \frac{B^2}{4} \sin \omega_2 t +$$

$$\frac{AB}{2} \cos(\omega_1 t - \theta_1)\cos(\omega_2 t - \theta_2) -$$

$$\frac{A^2}{2} \cos(\omega_1 t - \theta_1)\sin \omega_1 t - \frac{AB}{2} \cos(\omega_1 t - \theta_1)\sin \omega_2 t -$$

$$2\cos(\omega_2 t - \theta_2)\sin \omega_1 t - \frac{B^2}{2} \cos(\omega_2 t - \theta_2)\sin \omega_2 t +$$

$$\frac{AB}{2} \sin \omega_1 \sin \omega_2 t$$

The first four terms will produce a constant and a double frequency term while the 5th, 7th, 8th and 10th terms will generate the sum frequency and the difference frequency. However, if we assume that the low pass video filter filters out all the frequencies including and above the difference frequency, the output at A can be written as $$A_2 = \frac{A^2}{4} + \frac{B^2}{4} - \frac{A^2}{4} \sin \theta_1 - \frac{B^2}{4} \sin \theta_2 \tag{6}$$

Similarly, the other outputs can be written as $$B_2 = \frac{A^2}{4} + \frac{B^2}{4} - \frac{A^2}{4} \sin \theta_1 + \frac{B^2}{4} \sin \theta_2 \tag{7}$$

$$C_2 = \frac{A^2}{4} + \frac{B^2}{4} - \frac{A^2}{4} \cos \theta_1 + \frac{B^2}{4} \cos \theta_2 \tag{8}$$

$$D_2 = \frac{A^2}{4} + \frac{B^2}{4} - \frac{A^2}{4} \cos \theta_1 - \frac{B^2}{4} \cos \theta_2 \tag{9}$$

Passing these signals through the differential amplifiers, the outputs are $$E_1 = \frac{A^2}{2} \sin \theta_1 + \frac{B^2}{2} \sin \theta_2 \tag{10}$$

$$E_2 = \frac{A^2}{2} \sin \theta_1 + \frac{B^2}{2} \sin \theta_2 \tag{11}$$

These results can be combined and expressed in the following complex forms;

$$E_2 + jE_1 = \frac{A^2}{2} \exp(-j\theta_1) + \frac{B^2}{2} \exp(-j\theta_2) \tag{12}$$

$$E_2 - jE_1 = -\frac{A^2}{2} \exp(-j\theta_1) + \frac{B^2}{2} \exp(-j\theta_2) \tag{13}$$

The two above equations will be used in the following calculations.

3. Two Signal IFM Receiver Structure

Figure 2:
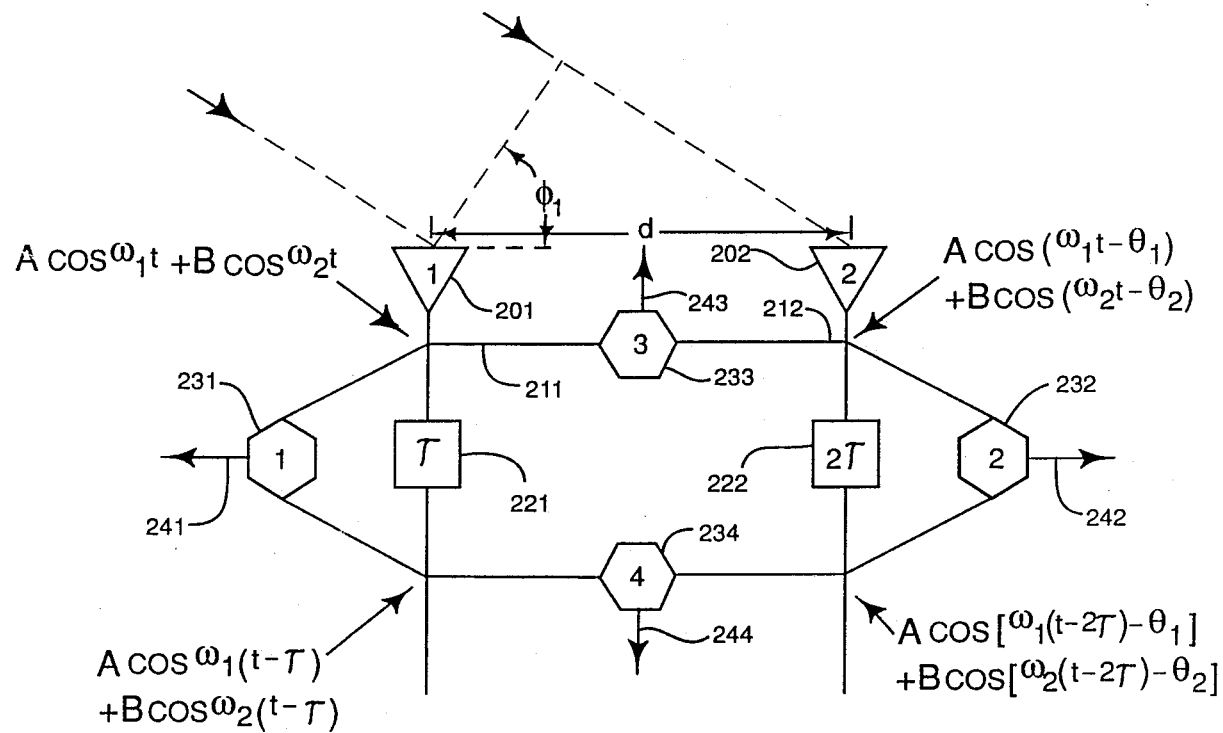
FIG. 2 is a block diagram of an IFM receiver according to the invention.

The basic configuration of the IFM receiver that can process two simultaneous signals is shown in FIG. 2. In this figure, there are two antennas 201 and 202, and they are separated by a distance d. There are also two delay lines 221 and 222 with delays of $\tau$ and $2\tau$ respectively; and four correlators 231, 232, 233 and 234 represented by hexagons. The output from antenna 201 is coupled to the input of the first delay line 221, and to inputs of the correlators 232 and 233. The output from antenna 202 is coupled to the input of the second delay line 222, and to inputs of the correlators 232 and 233. The output from the first delay line 221 is coupled to inputs of the correlators 231 and 234. The output from the second delay line 222 is coupled to inputs of the correlators 232 and 234. The signals at the inputs and outputs of the delay lines are labeled in FIG. 2. It is assumed that the combined power of the two input signals B(O) is measurable as $$B(O) = \frac{A^2}{2} + \frac{B^2}{2} \tag{14}$$

The outputs from the first correlator 231 are $$B(\tau) = \frac{A^2}{2} \exp(j\omega_1 \tau) + \frac{B^2}{2} \exp(j\omega_2 \tau) \tag{15}$$

and

-continued $$B(-\tau) = \frac{A^2}{2} \exp(-j\omega_1\tau) + \frac{B^2}{2} \exp(-j\omega_2\tau) \quad (16)$$

while the outputs from the second correlator 232 are $$B(2\tau) = \frac{A^2}{2} \exp(2j\omega_1\tau) + \frac{B^2}{2} \exp(2j\omega_2\tau) \quad (17)$$

and $$B(-2\tau) = \frac{A^2}{2} \exp(-j2\omega_1\tau) + \frac{B^2}{2} \exp(-j2\omega_2\tau) \quad (18)$$

The output of the third cross-correlator 233 is given as $$B(\theta) = \frac{A^2}{2} \exp(j\theta_1) + \frac{B^2}{2} \exp(j\theta_2) \quad (19)$$

while the outputs from the fourth cross-correlator 234 is $$B(\theta-\tau) = B(\tau) = \frac{A^2}{2} \exp[j(\theta_1 - \omega_1\tau)] + \frac{B^2}{2} \exp[j(\theta_2 - \omega_2\tau)] \quad (20)$$

where $\theta_1$ and $\theta_2$ are defined as $$\theta_1 = \frac{2\,d\sin\phi_1}{\lambda_1} \quad (21)$$

$$\theta_2 = \frac{2\,d\sin\phi_1}{\lambda_2} \quad (22)$$

where $\lambda_1$, $\lambda_2$ are the wavelengths and $\phi_1$, $\phi_2$ are the AOAs, the AOA $\phi_1$ of one signal being shown in FIG. 2. It should be noted that the $\theta_1$ and $\theta_2$ used in equations 19 through 22 are related specifically to the AOA, but $\theta_1$ and $\theta_2$ used in equations 1 through 13 represent a general phase shift.

Note that correlators three and four (233 and 234) each have only one output used, which provides enough information.

Equations 14 to 22 contain all the information required to solve the six unknown quantities in the following order $\omega_1$, $\omega_2$, A, B, $\theta_1$, $\theta_2$. The quantities on the left of the above equations are the measurable values that can be obtained from the IFM receiver at video bandwidth. As a practical matter, these noise smoothed quantities are measured only once and do not require the use of a high speed A/D converter.

4. Prony's Method

Figure 3:
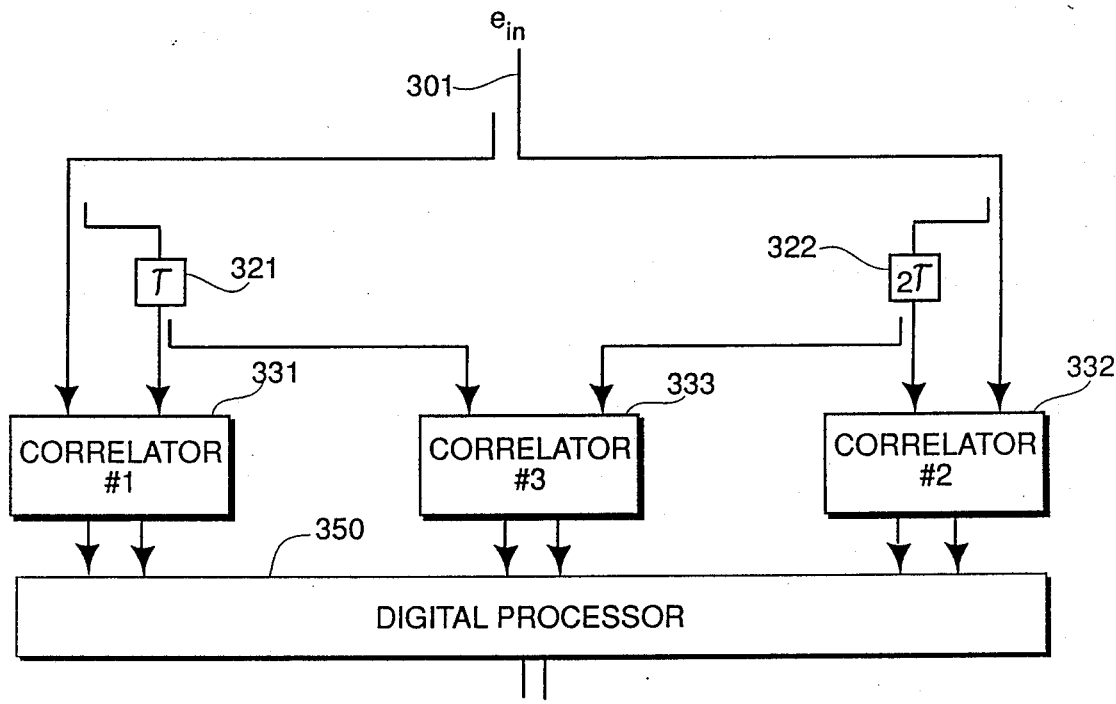
FIG. 3 is a block diagram showing a prior art three-discriminator IFM system design for simultaneous signal processing.

As stated in the "Background" section of this patent specification, Dr. Donald Tufts invented an approach using a DIFM (Digital Instantaneous Frequency Measurement) receiver to measure the frequencies of simultaneous signals through Prony's method, which is a mathematical method to solve certain equations. This approach is described in the final technical report AFWAL-TR-86-1131, "Fast Measurement of Signal Parameters in the Presence of Signal-Like Interference, Simultaneous Signal Processing", by S. M. Risteen, submitted Mar. 10, 1987. FIG. 3 is a block diagram of a three-discriminator system, corresponding to FIG. 3-1 of said report. There are two delay lines 321 and 322 with delays of $\tau$ and $2\tau$ respectively; and three correlators 331, 332, and 333. An input signal from a single line 301 is coupled to the inputs of delay lines 321 and 322, and to inputs of the correlators 331 and 333. The output from the first delay line 321 is coupled to inputs of the correlators 331 and 333. The output from the second delay line 322 is coupled to inputs of the correlators 332 and 333. The pairs of outputs from the three correlators are supplied to a digital processor 350.

The study described in the report shows how the data from the three discriminators (phase correlators) can be used to resolve two signals that are coincident at the DIFM input. An abstract for Section 3.0 of the report "Signal Processing Theory" states that "The process of estimation of polynomial parameters is the Prony method which is covered in many books on numerical analysis. When the Prony method of polynomial estimation is used, a set of simultaneous equations result which may be solved for linear prediction coefficients which, in turn, determine the signal input frequencies. . . . The simultaneous signal processing method, as described herein, results from the identification of the integral terms with the outputs of the IFM discriminators."

Figure 4:
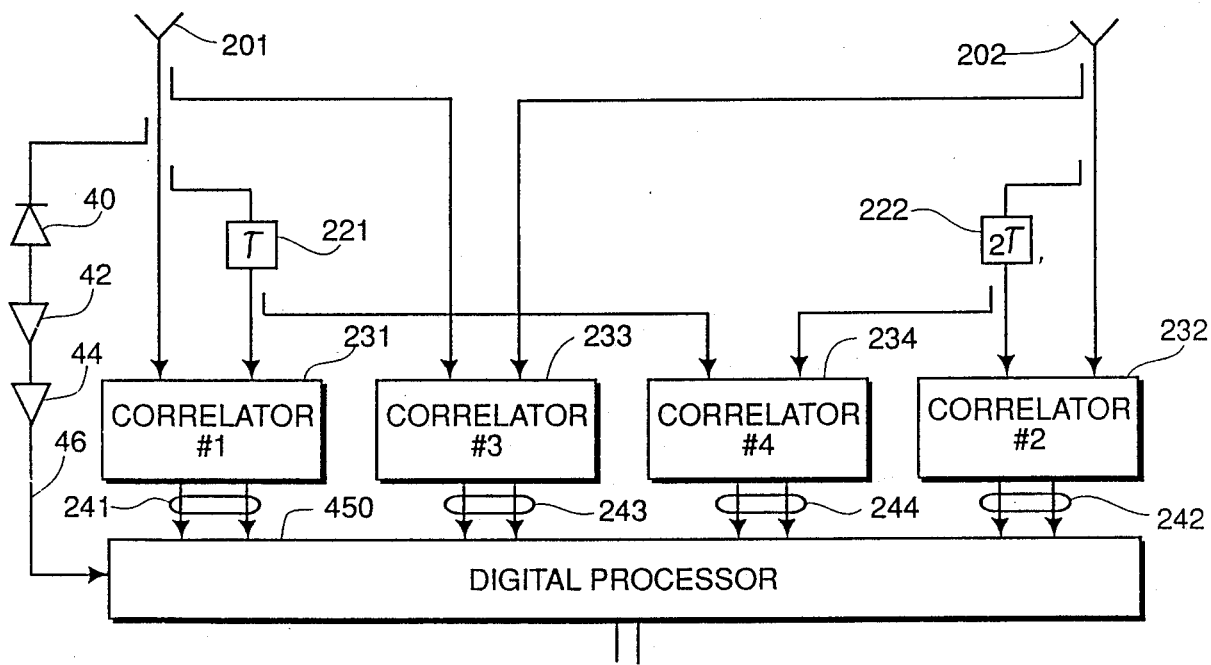
FIG. 4 is another block diagram of the IFM receiver shown in FIG. 2.

FIG. 4 is another block diagram of applicants' receiver shown in FIG. 2, redrawn in the same form as the prior art of FIG. 3. The correlators 231, 232, 233 and 234 have their respective pairs of outputs 241, 242, 243 and 244 connected to a digital processor 450.

An IFM receiver also usually has a video section, shown in FIG. 4 as a detector 40 having its input coupled to the antenna 201 and its output coupled via an amplifier 42 to a comparator 44. The output of the comparator 44 is a video signal supplied via a line 46 to the digital processor 450. The input to the detector 40 could alternatively be from a separate omni-directional antenna. The video section is used in an IFM receiver to generate the information for measuring pulse amplitude (PA), pulse width (PW) and for initiating the frequency sample window.

In the method proposed by applicants, the frequencies $\omega_1$ and $\omega_2$ are evaluated using the extended Prony's algorithm. The Prony method is a high resolution parametric special estimator that solves a specific set of simultaneous non-linear equations and operates directly on the correlator outputs of the IFM receivers. To solve for $\omega_1$ and $\omega_2$, the first step is to form a set of linear prediction equations from equations (14) to (18) as follows:

$$B(\tau) = G_1 B(O) + G_2 B(-\tau) \quad (23)$$

$$B(2\tau) = G_1 B(\tau) + G_2 B(O) \quad (24)$$

where $G_1$ and $G_2$ are two new introduced unknowns which can be solved as $$G_1 = \frac{B(\tau)B(O) - B(-\tau)B(2\tau)}{B^2(O) - B(\tau)B(-\tau)} \quad (25)$$

$$G_2 = \frac{B(O)B(2\tau) - B^2(\tau)}{B^2(O) - B(\tau)B(-\tau)} \quad (26)$$

It can easily be shown by substituting Equations (14) through (18) that $$G_1 = \exp(j\omega_1\tau) + \exp(j\omega_2\tau) \quad (27)$$

and $$G_2 = -\exp(j\omega_1\tau + j\omega_2\tau) \quad (28)$$

From the above two equations, $\omega_1$ and $\omega_2$ can be solved as $$\exp(j\omega_1\tau) = \frac{G_1 + G_3}{2} = H_1 \qquad (29)$$

$$\exp(j\omega_2\tau) = \frac{G_1 - G_3}{2} = H_2 \qquad (30)$$

where $$G_3 = \sqrt{(G_1^2 + 4G_2)} = \exp(j\omega_1\tau) - \exp(j\omega_2\tau) \qquad (31)$$

It follows that $$\omega_1 = \frac{1}{\tau}\tan^{-1}[I_m(H_1)/Re(H_1)] \qquad (32)$$

$$\omega_2 = \frac{1}{\tau}\tan^{-1}[I_m(H_2)/Re(H_2)] \qquad (33)$$

where the Re [ ] and Im [ ] represent the real and imaginary parts of a complex variable.

5. Calculations of AOAs

The calculations of the AOAs of the two signals is straightforward. From Equations (14) and (15) one can obtain $$\frac{A^2}{2} = \frac{H_2 B(O) - B(\tau)}{H_2 - H_1} \qquad (34)$$

$$\frac{B^2}{2} = \frac{B(\tau) - H_1 B(O)}{H_2 - H_1} \qquad (34)$$

Theoretically, one can solve the AOA of the input signals with three correlators. The additional information required can be obtained from the third correlator as $$B(-\theta) = \frac{A^2}{2}\exp(-j\theta_1) + \frac{B^2}{2}\exp(-j\theta_2) \qquad (36)$$

Although the angles $\theta_1$ and $\theta_2$ can be estimated with this approach, the following difficulties were observed: (1) one has to solve a quadratic equation, for $\theta_1$, $\theta_2$ with results that are highly sensitive to noise and (2) there is not enough information to correctly pair a frequency with its corresponding AOA. However, if we use the information from a fourth correlator, we can obtain a set of two linear equations which provide a ($\theta_1$, $\theta_2$) solution that resolves the ambiguity problem by correctly pairing the input frequency with its angle of arrival. In effect, the fourth correlator provides an additional independent condition which yields as a consequence of the cross-correlation estimate and the nature of IFM processing, a set of parametric linear equations that result in an unambiguous estimate of $\theta_1$ and $\theta_2$.

Using Equations (19) and (20), the following results are obtained $$\exp(j\theta_1) = \frac{2[H_1 B(\theta) - B(\theta - \tau)]}{A^2(H_2 - H_1)} = M_1 \qquad (37)$$

and $$\exp(j\theta_2) = \frac{2[B(\theta - \tau) - H_2 B(\theta)]}{B^2(H_2 - H_1)} = M_2 \qquad (38)$$

Therefore, it follows that $$\theta_1 = \arctan[Im(M_1)/Re(M_1)] \qquad (39)$$

and $$\theta_2 = \arctan[Im(M_2)/Re(M_2)] \qquad (40)$$

which leads directly by Equations (21) and (22) to $$\phi_1 = \arcsin\frac{\theta_1\lambda_1}{2d} = \arcsin\frac{\theta_1\pi}{\omega_1 d} \qquad (41)$$

and $$\phi_2 = \arcsin\frac{\theta_2\lambda_2}{2d} = \arcsin\frac{\theta_2\pi}{\omega_2 d} \qquad (42)$$

where $\omega_1$ and $\omega_2$ are known values (from Equations 32 and 33).

From Equations (39) and (40), it is obvious that only the phase information is needed from Equations (37) and (38). Since A and B represent the power of the input signals, they are real and as a result Equations (34) and (35) are not actually necessary.

CONCLUSION

To summarize the operation of the digital processor 450 in FIG. 4, when a pulse signal arrives at the antennas 201 and 202, video analog signals will appear at lines 46 and 146, and also at the outputs 241, 242, 243 and 244 from the correlators. After a short predetermined time from the beginning of a pulse at line 46, all of the inputs to the digital processor 450 are sampled and converted to digital form. This pulse may contain one, two, or more signals. Assume that there are two signals with amplitudes A and B, frequencies $\omega_1$ and $\omega_2$, and angles of arrival $\phi_1$ and $\phi_2$. The digitized values represent $B(O)$, $B(\tau)$, $B(-\tau)$, $B(2\tau)$, $B(-2\tau)$, $B(\theta)$ and $B(\theta-\tau)$ as defined by Equations (14), (15), (16), (17), (18), (19) and (20). These signals are combined to obtain values for $G_1$, $G_2$ and $G_3$ as given by Equations (25), (26) and (31); and then values for $H_1$ and $H_2$ as given by Equations (29) and (30). The values of $H_1$ and $H_2$ are resolved into real and imaginary parts, and used in Equations (32) and (33) along with the known value of $\tau$ to obtain the two frequencies $\omega_1$ and $\omega_2$. The amplitudes A and B of the two signals may be obtained using Equations (34) and (35), but are not actually necessary. Values are determined for $M_1$ and $M_2$ using equations (37) and (38), which are resolved into real and imaginary parts. The angles of arrival (AOAs) are then found using equations (39) and (40). The above mathematical operations can be performed using a programmed microprocessor.

If there is only one signal, the denominator of Equations (25) and (26) goes to zero, and this information can be used to process the signal in a normal manner. A system could be designed to handle more than two signals.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. An instantaneous frequency measurement (IFM) receiver having inputs from first and second antennas separated by a distance d; said receiver comprising first and second delay lines having delay times of $\tau$ and $2\tau$ respectively; first, second, third and fourth IFM correlators; each correlator having first and second inputs; the first antenna being coupled to the first input of the first correlator, the first delay line and the first input of the third correlator; the second antenna being coupled to the first input of the second correlator, the second delay line and the second input of the third correlator; the first delay line having an output coupled to the second input of the first correlator and the first input of the fourth correlator; the second delay line having an output coupled to the second input of the second correlator and the second input of the fourth correlator; and digital processing means having inputs coupled to outputs of said correlators for performing mathematical calculations to solve for the frequencies and the angles of arrival of signals at the receiver, with the input frequency correctly paired with its angle of arrival.

2. An instantaneous frequency measurement (IFM) receiver according to claim 1, wherein the digital processing means, responsive to the reception of a pulse at said antennas comprising two signals with a combined power of B(O), amplitudes A and B, frequencies $\omega_1$ and $\omega_2$, and angles of arrival $\phi_1$ and $\phi_2$, after a short predetermined time from the beginning of said pulse, includes means for sampling and using in digital form all of the inputs to the digital processor means; wherein the digitized values represent B(O), B($\tau$), B($-\tau$), B($2\tau$), B($-2\tau$), B($\theta$) and B($\theta-\tau$) as defined by the equations $$B(O) = \frac{A^2}{2} + \frac{B^2}{2}$$

the outputs from the first correlator being $$B(\tau) = \frac{A^2}{2} \exp(j\omega_1\tau) + \frac{B^2}{2} \exp(j\omega_2\tau)$$

and $$B(-\tau) = \frac{A^2}{2} \exp(-j\omega_1\tau) + \frac{B^2}{2} \exp(-j\omega_2\tau)$$

the outputs from the second correlator being $$B(2\tau) = \frac{A^2}{2} \exp(2j\omega_1\tau) + \frac{B^2}{2} \exp(2j\omega_2\tau)$$

and $$B(-2\tau) = \frac{A^2}{2} \exp(-j2\omega_1\tau) + \frac{B^2}{2} \exp(-j2\omega_2\tau)$$

the output of the third correlator being $$B(\theta) = \frac{A^2}{2} \exp(j\theta_1) + \frac{B^2}{2} \exp(j\theta_2)$$

the outputs from the fourth correlator being $$B(\theta-\tau) = B(\tau) = \frac{A^2}{2} \exp[j(\theta_1 - \omega_1\tau)] + \frac{B^2}{2} \exp[j(\theta_2 - \omega_2\tau)]$$

where $\theta_1$ and $\theta_2$ are defined as $$\theta_1 = \frac{2d \sin \phi_1}{\lambda_1}$$

$$\theta_2 = \frac{2d \sin \phi_1}{\lambda_2}$$

wherein the digital processing means further includes means for combining the above values to obtain values for variables $G_1$, $G_2$ and $G_3$ and then values for $H_1$ and $H_2$ as defined by the following equations $$G_1 = \frac{B(\tau)B(O) - B(-\tau)B(2\tau)}{B^2(O) - B(\tau)B(-\tau)}$$

$$G_2 = \frac{B(O)B(2\tau) - B^2(\tau)}{B^2(O) - B(\tau)B(-\tau)}$$

$$G_3 = \sqrt{(G_1^2 + 4G_2)} = \exp(j\omega_1\tau) - \exp(j\omega_2\tau)$$

$$H_1 = \frac{G_1 + G_2}{2}$$

$$H_2 = \frac{G_1 - G_3}{2}$$

the values of $H_1$ and $H_2$ being resolved into real and imaginary parts Re [ ] and Im [ ] and used along with the known value of $\tau$ to obtain the two frequencies $\omega_1$ and $\omega_2$ as follows:

$$\omega_1 = \frac{1}{\tau} \tan[Im(H_1)/Re(H_1)]$$

$$\omega_2 = \frac{1}{\tau} \tan[Im(H_2)/Re(H_2)]$$

wherein the digital processing means further includes means to obtain values for variables $M_1$ and $M_2$, which are resolved into real and imaginary parts, and used to obtain the two angles of arrival (AOAs) as follows:

$$M_1 = \frac{2[H_1B(\theta) - B(\theta - \tau)]}{A(H_2 - H_1)}$$

and $$M_2 = \frac{2[B(\theta - \tau) - H_2B(\theta)]}{B(H_2 - H_1)}$$

$$\theta_1 = \arctan[Im(M_1)/Re(M_1)]$$

and $$\theta_2 = \arctan[Im(M_2)/Re(M_2)]$$

which leads directly to $$\phi_1 = \arcsin \frac{\theta_1 \pi}{\omega_1 d}$$

and $$\phi_2 = \arcsin \frac{\theta_2 \pi}{\omega_2 d}$$

where $\omega_1$ and $\omega_2$ are known values.

* * * * *

UNITED STATES PATENT AND TRADEMARK OFFICE
CERTIFICATE OF CORRECTION

PATENT NO. : 4,977,365
DATED : December 11, 1990
INVENTOR(S) : James B.Y. Tsui et al It is certified that error appears in the above-identified patent and that said Letters Patent is hereby corrected as shown below:

Col 3, line 38, equation 3, the second "−" should be
--- + ---.

Col 3, line 41, equation 4, the second and third "−" should be --- + ---.

Col 4, line 49, "232" should read ---231---.

Signed and Sealed this

Eleventh Day of August, 1992

Attest:

DOUGLAS B. COMER

Attesting Officer

Acting Commissioner of Patents and Trademarks